United States Patent
Lee et al.

(10) Patent No.: US 8,471,320 B2
(45) Date of Patent: *Jun. 25, 2013

(54) MEMORY LAYOUT STRUCTURE

(75) Inventors: Tzung-Han Lee, Taipei (TW); Chung-Lin Huang, Taoyuan County (TW); Ron Fu Chu, Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/343,668

(22) Filed: Jan. 4, 2012

(65) Prior Publication Data

US 2013/0119448 A1 May 16, 2013

(30) Foreign Application Priority Data

Nov. 14, 2011 (TW) .............................. 100141489 A

(51) Int. Cl.
  *H01L 27/108* (2006.01)
  *H01L 29/76* (2006.01)
  *H01L 29/94* (2006.01)
  *H01L 31/119* (2006.01)
  *H01L 31/062* (2006.01)
  *H01L 31/113* (2006.01)

(52) U.S. Cl.
  USPC ........... 257/296; 257/202; 257/300; 257/390; 257/391; 257/401; 257/905; 257/906; 257/907; 257/908; 257/E27.084; 257/E29.026; 257/E29.027; 257/E29.028

(58) Field of Classification Search
  USPC ................. 257/202, 296, 300, 390, 391, 401, 257/905, 906, 907, 908, E27.084, E29.026, 257/E29.027, E29.028
  See application file for complete search history.

(56) References Cited

U.S. PATENT DOCUMENTS

| | | | | |
|---|---|---|---|---|
| 5,714,779 | A * | 2/1998 | Auer et al. ..................... | 257/306 |
| 6,406,971 | B1 | 6/2002 | Chien | |
| 7,034,408 | B1 * | 4/2006 | Schloesser ..................... | 257/213 |
| 7,342,272 | B2 * | 3/2008 | Abbott .......................... | 257/296 |
| 7,576,389 | B2 * | 8/2009 | Tanaka .......................... | 257/330 |
| 7,642,572 | B2 * | 1/2010 | Popp et al. .................... | 257/211 |
| 7,851,356 | B2 | 12/2010 | Tegen | |
| 7,883,970 | B2 * | 2/2011 | Kim et al. ..................... | 438/270 |
| 2004/0156255 | A1 * | 8/2004 | Tsukikawa ..................... | 365/206 |
| 2008/0035991 | A1 * | 2/2008 | Lee et al. ....................... | 257/331 |
| 2008/0055958 | A1 * | 3/2008 | Takemura et al. ............... | 365/63 |
| 2008/0073708 | A1 * | 3/2008 | Aiso .............................. | 257/334 |
| 2008/0121990 | A1 * | 5/2008 | Hasunuma ...................... | 257/333 |
| 2008/0251827 | A1 * | 10/2008 | Cheng et al. ................... | 257/301 |
| 2008/0266927 | A1 * | 10/2008 | Lee et al. ........................ | 365/63 |
| 2010/0148236 | A1 * | 6/2010 | Kadoya ......................... | 257/306 |
| 2010/0193966 | A1 * | 8/2010 | Kim et al. ..................... | 257/774 |
| 2011/0204453 | A1 * | 8/2011 | Gilgen .......................... | 257/401 |
| 2011/0260288 | A1 * | 10/2011 | Sukekawa et al. ............. | 257/532 |
| 2012/0012907 | A1 * | 1/2012 | Lee et al. ...................... | 257/296 |
| 2012/0091518 | A1 * | 4/2012 | Sukekawa ..................... | 257/296 |

* cited by examiner

*Primary Examiner* — Ida M Soward
(74) *Attorney, Agent, or Firm* — Winston Hsu; Scott Margo

(57) ABSTRACT

A memory array layout includes an active region array having a plurality of active regions, wherein the active regions are arranged alternatively along a second direction and parts of the side of the adjacent active regions are overlapped along a second direction; a plurality of first doped region, wherein each first doped region is disposed in a middle region; a plurality of second doped region, wherein each second doped region is disposed in a distal end region respectively; a plurality of recessed gate structures; a plurality of word lines electrically connected to each recessed gate structure respectively; a plurality of digit lines electrically connected to the first doped region respectively; and a plurality of capacitors electrically connected to each second doped region respectively.

9 Claims, 6 Drawing Sheets

MEMORY LAYOUT STRUCTURE

BACKGROUND OF THE INVENTION

1. Field of the Invention

The invention generally relates to a memory structure, and in particular, the present invention relates more to a memory array including buried word lines for dynamic random access memory devices.

2. Description of the Prior Art

A Dynamic Random Access Memory (DRAM) is an essential element in many electronic products. In a DRAM, numerous memory cells comprise array regions which can be used to store data. Each memory cell consists of a metal oxide semiconductor (MOS) electrically connected in series to a capacitor wherein the capacitor has a storage node which is electrically connected to a conductive material of a node contact, thereby forming a storage channel when coupled with a MOS drain; this way, data can be relayed between the capacitor and the digit line in the control of a word line.

With the trends of shrinking dimensions of the memory cells, a variety of DRAM layouts is provided. In one type of the DRAM layouts, active regions include all two memory cells, which are arranged alternatively. Two word lines pass through a same active region and areas overlapped between the word lines and the active regions are used as gate structures. A digit line contact plug is disposed between the two memory cells and is electrically connected to the active region and a digit line. As we know, in this case, one digit line engages two memory cells. Although various designs of memory arrays are provided, there is always a continuing need for developing a novel memory layout structure and memory structures that have a relatively high integration ratio of memory cells.

SUMMARY OF THE INVENTION

The main objective of the invention is to provide a memory array layout which has a relatively compact capacitor layout and a relatively large capacitor area for storing charge.

According to one embodiment of the present invention, a memory array layout is provided. The array formation comprises the following steps. A substrate is provided. An active region array disposed on the substrate wherein a plurality of active regions is arranged along a first direction and a second direction, the active regions are arranged alternatively along the second direction and portions of sides of the two adjacent active regions are partially overlapped along the second direction. A plurality of first doped regions is formed, wherein each of the first doped regions is disposed in a middle region within each of the active regions. A plurality of second doped regions is formed, wherein the second doped regions are disposed in distal end regions, within each of the active regions. A plurality of recessed gate structures is disposed between the middle regions and the distal end regions of the active regions in the substrate. A plurality of word lines is disposed between the middle regions and the distal end regions of the active regions, wherein each of the word lines along a third direction perpendicular to the first direction is electrically connected to the respective recessed gate structure. A plurality of the digit lines is disposed above the word lines, wherein each of the digit lines along the first direction is electrically connected to the respective first doped region in the active region. A plurality of capacitors is then disposed above the second doped regions and each of the capacitor is electrically connected to the respective second doped region via a self-aligned contact plug, wherein the self-aligned contact plug is between the respective two adjacent digit lines and the respective two adjacent word lines.

According to another embodiment of the present invention, a memory structure is provided with the following components. An active region disposed in a substrate. A first doped region is disposed in a middle region of the active region. Two second doped regions are disposed in opposite distal end regions of the active region. Two recessed gate structures are disposed respectively in a trench between the middle region and the distal end regions. A gate electrode is disposed in the trench. A gate dielectric layer is disposed on a bottom and the sidewalls of the trench, wherein the gate dielectric layer is located between the gate electrode and the substrate. A digit line contact plug is disposed above the first doped region and electrically connected to the first doped region. Two self-aligned contact plugs are disposed respectively above the respective second doped region and each of the self-aligned contact plugs is electrically connected to the respective second doped region. Two capacitors are also disposed above each of the self-aligned contact plugs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
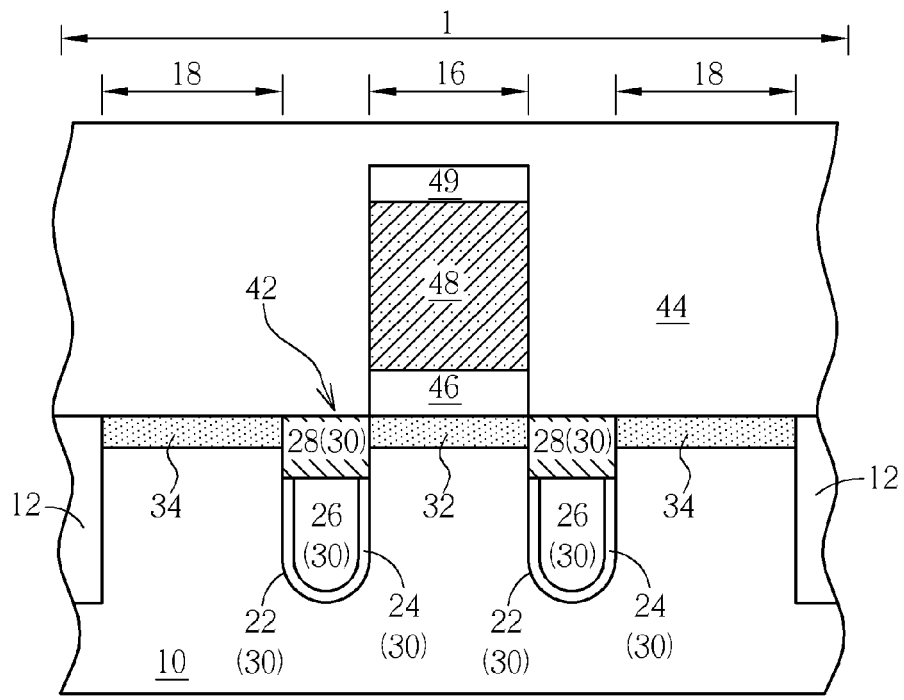
FIG. 1 is a schematic, cross-sectional diagram taken along a line AA' in FIG. 2.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
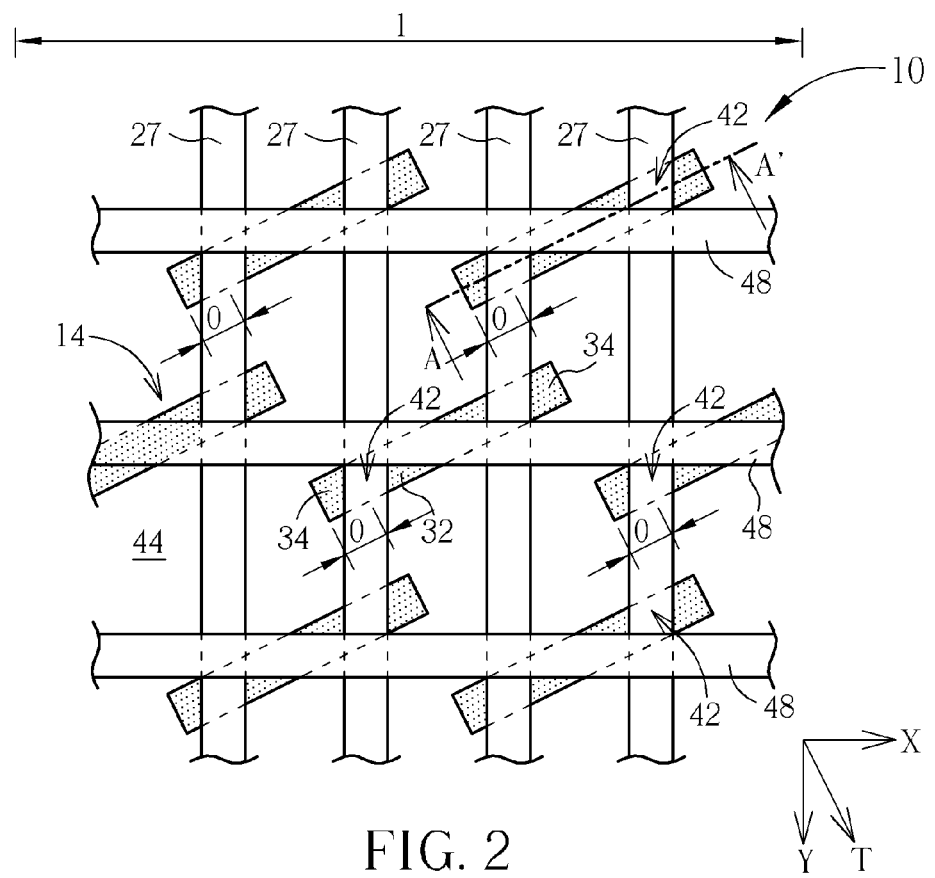
FIG. 2 is a top-view diagram showing a layout of a dynamic random access memory array at the beginning of the fabricating process according to one embodiment of the invention.

FIGS. 1 to 7 are schematic diagrams showing a method for fabricating a dynamic random access memory array according to embodiments of the present invention. As shown in FIGS. 1 and 2, FIG. 2 is a top-view diagram showing a layout of a DRAM array at the beginning of a fabricating process according to one embodiment of the present invention. FIG. 1 is a schematic, cross-sectional diagram taken along a line AA' in FIG. 2. At the beginning of a fabrication process, a substrate 10 having an active region array 1 is provided, which comprises a plurality of active regions 14 arranged in an array layout. A middle region 16 and two distal end regions 18 are defined in each of the active regions 14. It is worth noting that the active regions 14 extends along both a first direction X and a second direction T, wherein the active regions 14 along the second direction T are arranged alternatively and parts of the sides of the two adjacent active regions 14 along the second direction T are partially overlapped to form overlapped regions O. It should be noted that, in all embodiments of the invention, there is no right angle but an acute angle between the first direction X and the second direction T.

Please still refer to FIGS. 1 and 2. Shallow trench isolations (STI) 12 are disposed between the active regions 14 in the substrate 10, which may be fabricated by forming shallow trenches (not shown) in the substrate 10 first and then filling isolation material, such as silicon oxide, silicon oxynitride or the like, into the shallow trenches. In addition, each active region 14 includes two recessed gate structures 30 disposed between the middle region 16 and the distal end regions 18 in the substrate. A fabricating method of the recessed gate structure 30 could be performed as follows: two gate trenches 22 are formed within each active region 14 in the substrate 10; a gate dielectric layer 24, such as silicon oxide or the like, is formed on sidewalls of the gate trenches 22 by oxidation or deposition method, like thermal oxidation or vapor phase deposition, but is not limited thereto. A gate electrode 26 is then formed in each gate trench 22 and fabrication processes of which may include: forming a conductive layer (not shown) on the substrate 10 and filling the conductive layer into the gate trenches 22 concurrently; performing a planarization and an etch back process to remove parts of the conductive layer inside the gate trenches 22, so that the remaining conductive layer may serve as the gate electrodes 26, where compositions of the gate electrodes 26 may comprise metal, doped polysilicon or other similar conductive material; finally, a cap layer 28 is formed on top surface of the gate electrode 26. After finishing the preceding processes, the recessed gate structures 30 are ready. Gate electrodes 26, which are along a third direction Y perpendicular to the first direction X, comprise a word line 27 embedded in the substrate 10. A first doped region 32 and a second doped region 34 may be formed separately or concurrently on the sides of each recessed gate structure 30 in the substrate 10. At this time, recessed-type transistors 42 are obtained and each of which includes the recessed gate structures 30, the first doped region 32 and the two second doped regions 34.

Digit lines 48 are then formed on the substrate 10. Each of the digit lines 48 is electrically connected to the first doped region 32 via a digit line contact plug 46, while each digit line contact plug 46 contacts partial areas in each first doped region 32 only. In addition, top surface of the digit line 48 is covered by a cover layer 49 and sides of the digit line 48 may comprise single-layered or multiple layer spacers (not shown). Since the methods for fabricating the digit lines 48 are well-know, detailed description of which is therefore omitted, for sake of clarity. A polysilicon layer 44 is then formed to cover the entire substrate 10 and the recessed-type transistors 42. Compositions of the polysilicon layer 44 may be doped polysilicon. It should be noted that, since the polysilicon layer 44 covers the digit lines 48 entirely, the digit lines 48 are inside the polysilicon layer 44.

Figure 3:
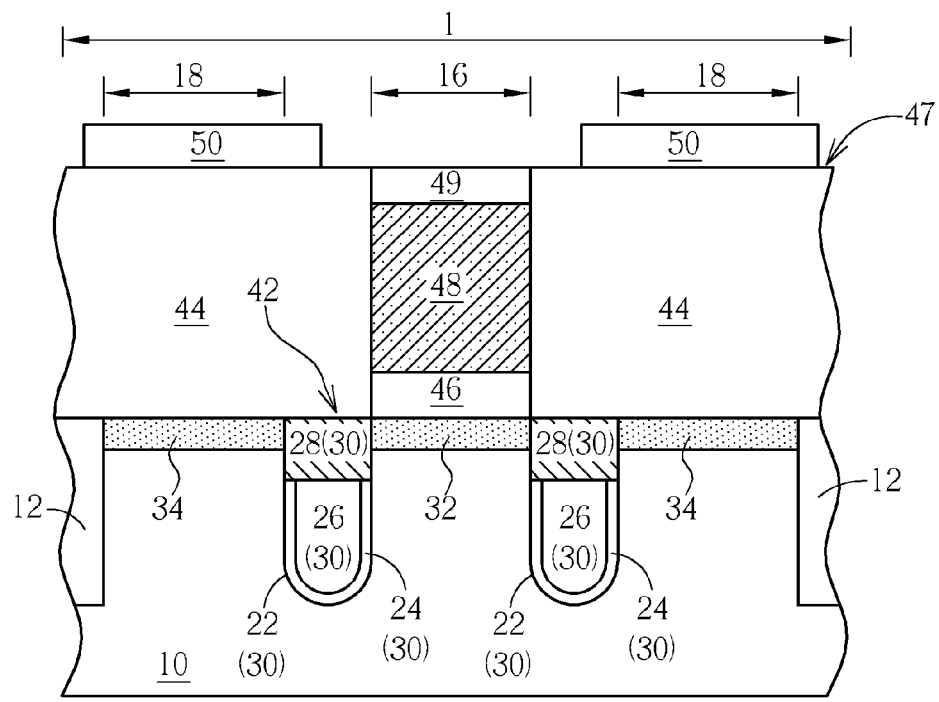
FIG. 3 is a schematic, cross-sectional diagram taken along a line AA' in FIG. 4.
Figure 4:
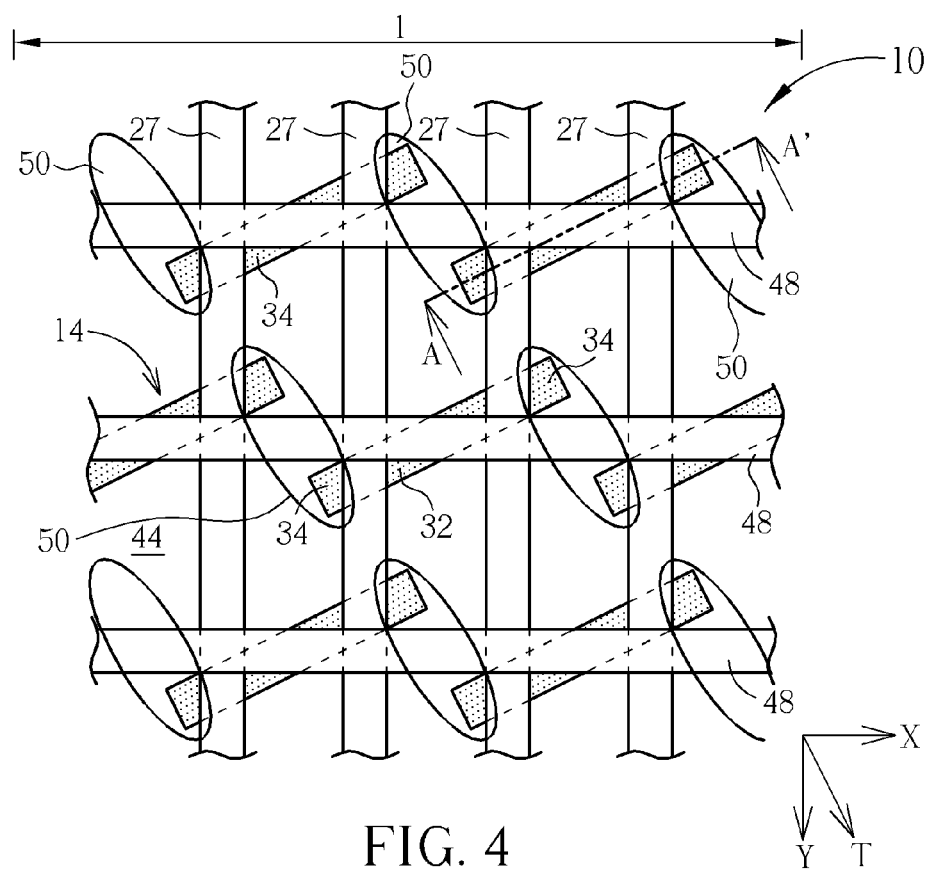
FIG. 4 is a top-view diagram showing a layout of a dynamic random access memory array in a step subsequent to FIG. 2 according to one embodiment of the invention.

Please refer to FIGS. 3 and 4. FIG. 4 is a top-view diagram showing a layout of a dynamic random access memory array in a step subsequent to a step shown in FIG. 2 according to one embodiment of the present invention. FIG. 3 is a schematic, cross-sectional diagram taken along a line AA' in FIG. 4. A planarization process, like Chemical Mechanical Polishing (CMP) for example, is carried out to have an upper surface 47 of the polysilicon layer 44 approximately leveled with the cover layer 49. By reference to FIG. 4, at this time, the polysilicon layers 44 are separated by the adjacent digit lines 48, so that each polysilicon layer 44 is electrically isolated from each other. Then, by using at least a photolithography process, a plurality of patterned photoresist layers 50 is formed above the substrate 10, which is used to define positions of self-aligned contact plugs (not shown) in the following steps.

Figure 5:
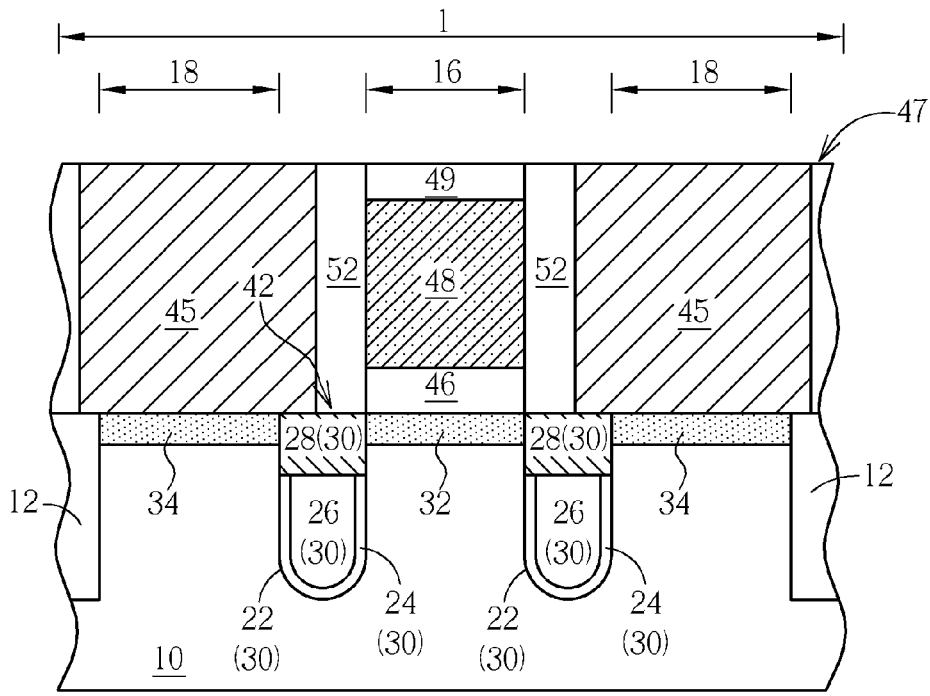
FIG. 5 is a schematic, cross-sectional diagram taken along a line AA' in FIG. 6.
Figure 6:
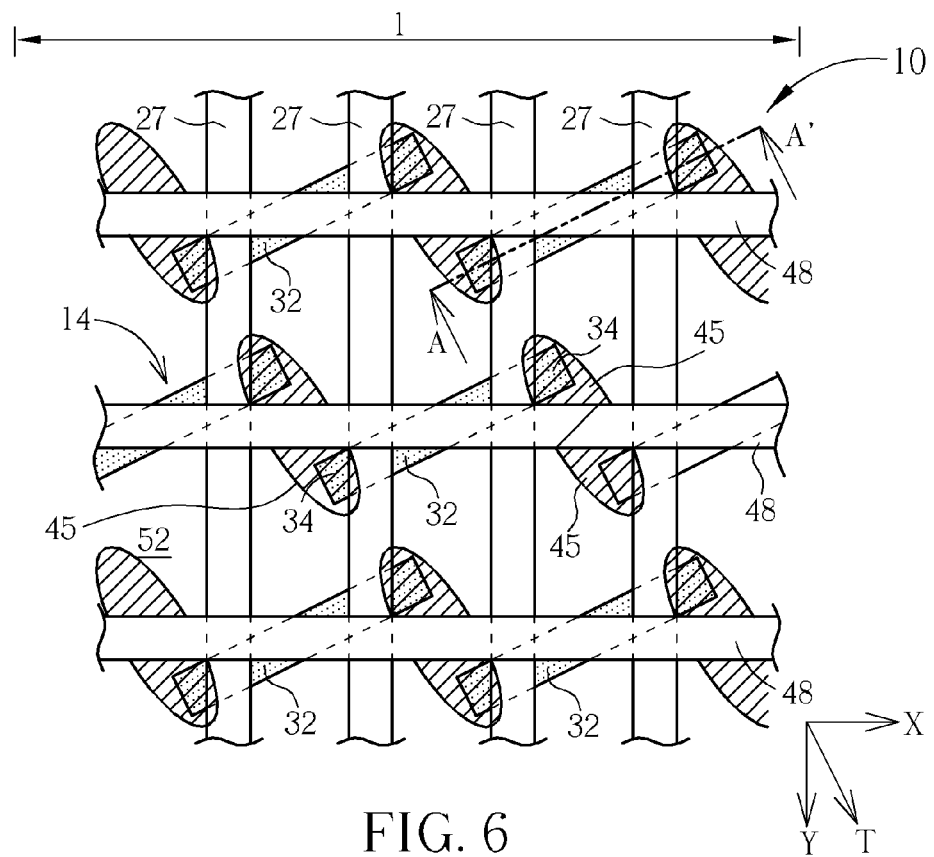
FIG. 6 is a top-view diagram showing a layout of a dynamic random access memory array in a step subsequent to FIG. 4 according to one embodiment of the invention.
Figure 7:
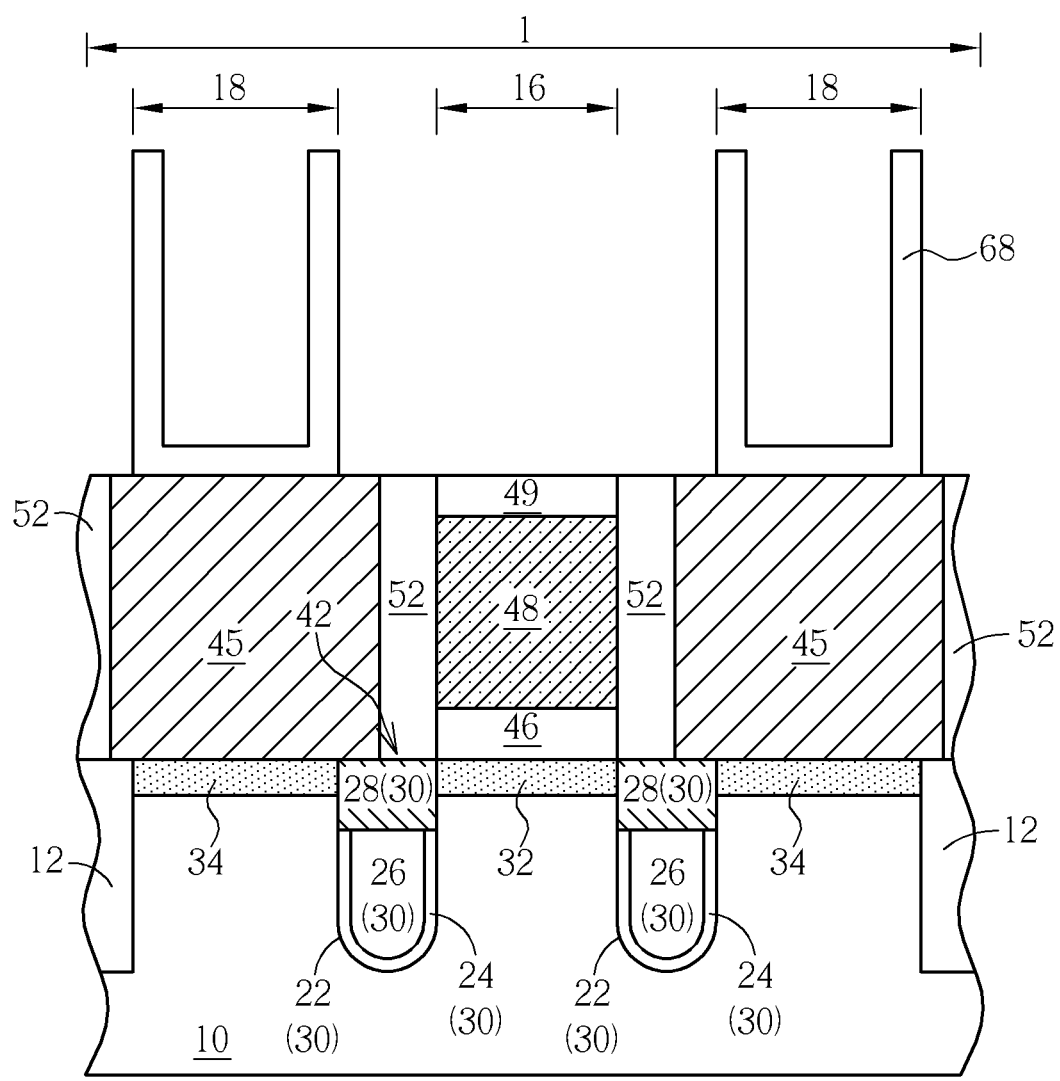
FIG. 7 is a schematic, cross-sectional diagram showing a partial structure of a dynamic random access memory in a step subsequent to FIG. 6 according to one embodiment of the invention.

Please refer to FIGS. 5 and 6, wherein FIG. 6 is a top-view diagram showing a layout of a dynamic random access memory array in a step subsequent to the step shown in FIG. 4 according to one embodiment of the invention and FIG. 5 is a schematic, cross-sectional diagram taken along a line AA' in FIG. 6. An etching process is performed to remove the polysilicon layer 44 exposed from the pattern photoresist layers 50, this way several self-aligned contact plugs 45 are formed in the respective second doped regions 34. It should be noted that a horizontal sectional area of each self-aligned contact plug 45 is approximately larger than an area of the respective second doped region 34. Then, a dielectric layer 52 is deposited and a planarization process is performed, so that a space (not shown) between the digit line 48 and the self-aligned contact plug 45 can be filled up with the dielectric layer 52. Finally, as shown in FIG. 7, a capacitor 68 is formed on each self-aligned contact plug 45; therefore, the capacitor 68 is electrically connected to the second doped region 34.

Figure 8:
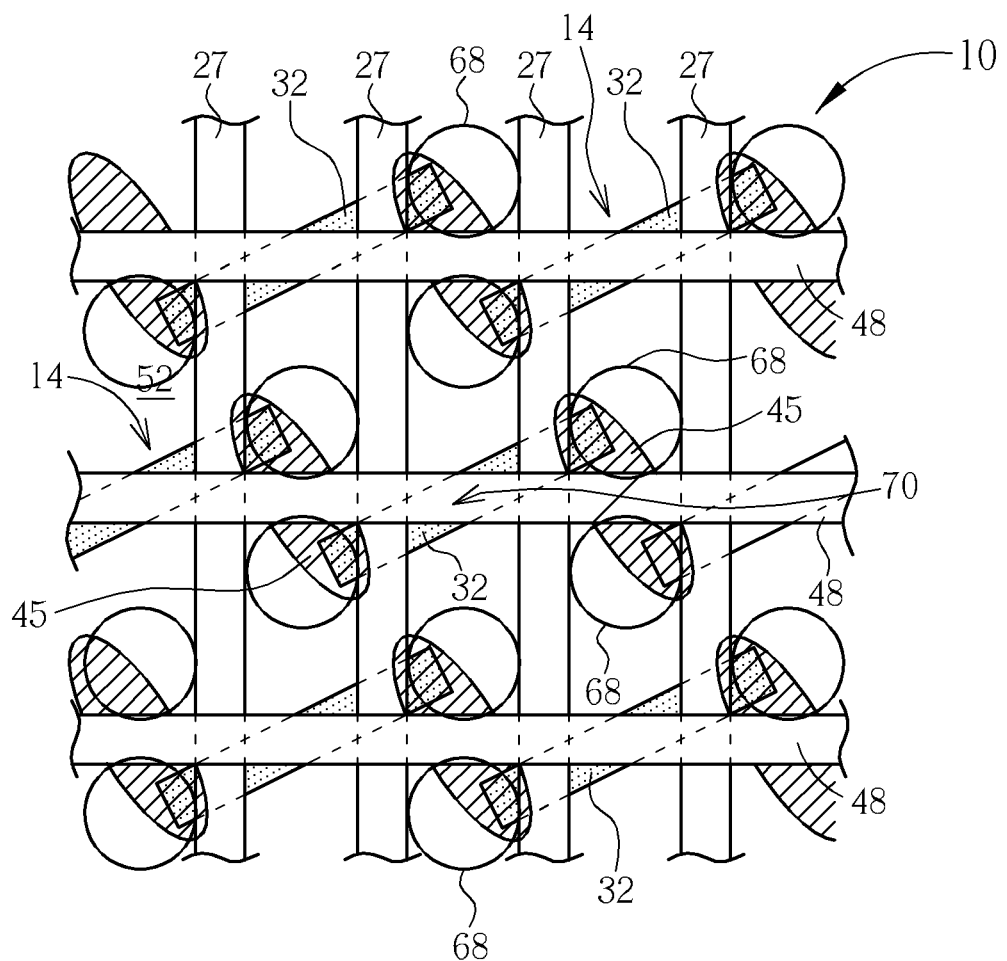
FIG. 8 is a top-view diagram showing a layout of a dynamic random access memory array according to one embodiment of the invention.
Figure 9:
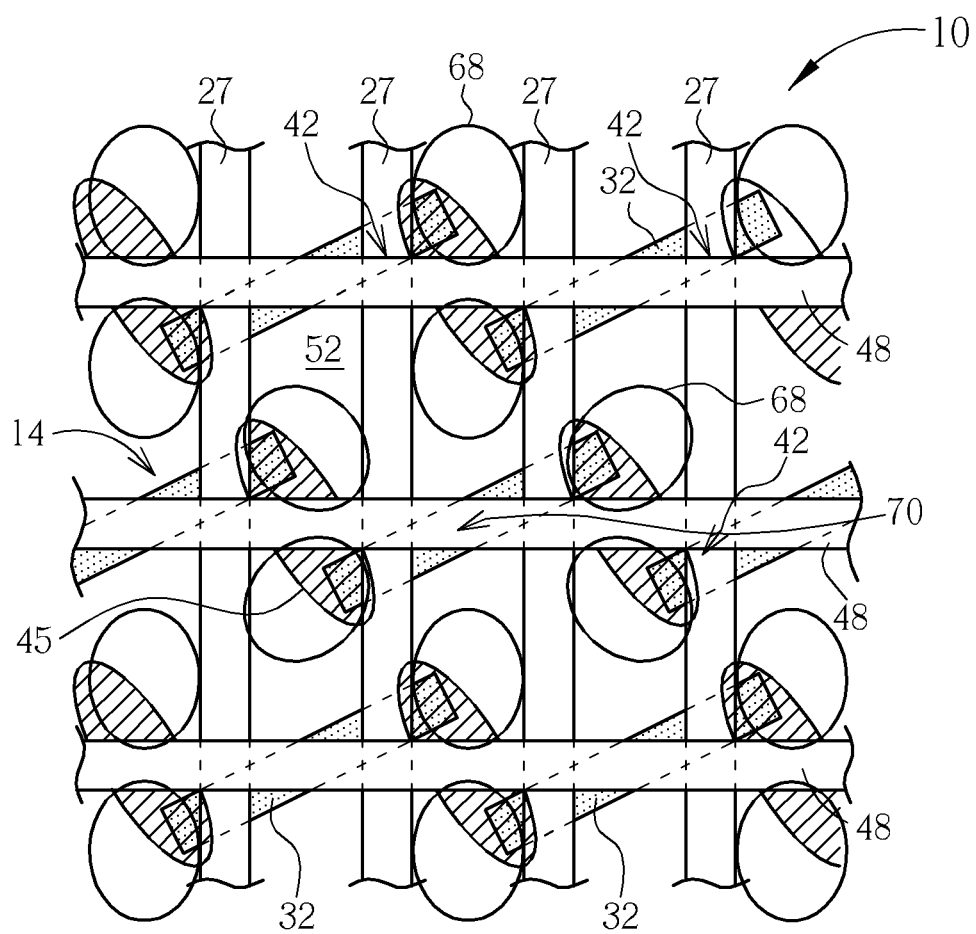
FIG. 9 is a top-view diagram showing a layout of a dynamic random access memory array according to another embodiment of the invention.

Please refer to FIGS. 8 and 9, which are top-view diagrams showing layouts of dynamic random access memory arrays according to two different embodiments of the invention. As shown in the FIGS. 8 and 9, horizontal section of the capacitor 68 may have circular shape, however, in another case, it may have oval shape or other suitable shape depending on requirements. Additionally, capacitors 68 can encircle respective centers 70 located in the active regions 14. Compared to conventional DRAM layouts, in this new DRAM layout, the amount of the capacitors 68 accommodated in a unit area can obviously be increased. In addition, the process window may be also improved due to a larger area of the self-aligned contact plug 45. Furthermore, thanks to the enhancement of the sidewall area of each capacitor 68, many more charges may be stored within a same substrate area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array layout, comprising,
   a substrate;
   an active region array disposed on the substrate and having a plurality of active regions arranged along a first direction and a second direction, wherein the active regions along the second direction are arranged alternatively and parts of sides of the two adjacent active regions are partially overlapped along the second direction;
   a plurality of first doped regions, wherein each of the first doped regions is disposed in a middle region within each of the active regions;
   a plurality of second doped regions, wherein the second doped regions are disposed in distal end regions within each of the active regions;
   a plurality of recessed gate structures disposed between the middle regions and the distal end regions of the active regions in the substrate;
   a plurality of word lines disposed between the middle regions and the distal end regions of the active regions, wherein each of the word lines along a third direction perpendicular to the first direction is electrically connected to the respective recessed gate structure;
   a plurality of digit lines disposed above the word lines, wherein each of the digit lines along the first direction is electrically connected to the respective first doped region in the active region; and
   a plurality of capacitors disposed above the second doped regions wherein each capacitor is electrically connected to the respective second doped region via a self-aligned contact plug, wherein the self-aligned contact plug is between the respective two adjacent digit lines and the respective two adjacent word lines.

2. The memory array layout according to claim 1, wherein the first direction and the second direction intersect with an acute angle or an obtuse angle.

3. The memory array layout according to claim 1, wherein areas overlaid by the word lines and the active regions overlap with positions of the recessed gate structures.

4. The memory array layout according to claim 1, wherein the second doped regions are not overlapped with the word lines and the digit lines.

5. The memory array layout according to claim 1, wherein each of the recessed gate structure comprises a gate electrode and a gate dielectric layer disposed between the gate electrode and the substrate.

6. The memory array layout according to claim 1, wherein each of the digit lines is electrically connected to each of the first doped regions via a digit line contact plug and the digit line contact plug is connected to partial areas of each first doped region.

7. The memory array layout according to claim 1, wherein each of the self-aligned contact plugs is directly connected to the respective entire second doped region.

8. The memory array layout according to claim 1, wherein the word lines are embedded in the substrate.

9. The memory array layout according to claim 1, wherein the active regions are electrically isolated from each other.

* * * * *